United States Patent [19]

Haug et al.

[11] Patent Number: 5,012,218
[45] Date of Patent: Apr. 30, 1991

[54] DEVICE FOR MEASURING AN ELECTRIC CURRENT USING A SOLENOID WITH REGULAR PITCH IN THE FORM OF A TORUS

[75] Inventors: Robert Haug, Orsay; Zhong-Jun He, Massy; Roger Hahn, Gif-sur-Yvette, all of France

[73] Assignee: Centre National de la Recherche Scientifique, Paris, France

[21] Appl. No.: 411,259

[22] Filed: Sep. 25, 1989

Related U.S. Application Data

[63] Continuation of Ser. No. 275,702, Nov. 25, 1988, abandoned, which is a continuation of Ser. No. 4,247, Jan. 5, 1987, abandoned, which is a continuation of Ser. No. 698,378, Feb. 5, 1985, abandoned.

[30] Foreign Application Priority Data

Feb. 6, 1984 [FR] France ................... 84 01754

[51] Int. Cl.$^5$ ................... H01F 27/30; H01F 40/06
[52] U.S. Cl. ................... 336/174; 324/127; 336/180; 336/229
[58] Field of Search ............ 336/174, 175, 176, 180, 336/170, 222, 229; 324/127

[56] References Cited

U.S. PATENT DOCUMENTS

| 723,016 | 3/1903 | Parcelle | 336/221 |
| 1,862,613 | 6/1932 | Tomoda | 336/175 X |
| 2,916,696 | 12/1959 | Schonstedt | 336/221 X |
| 2,958,835 | 11/1960 | Kolb, Jr. | 336/192 X |
| 4,390,813 | 6/1983 | Stanley | 336/178 |

FOREIGN PATENT DOCUMENTS

1541858 8/1971 Fed. Rep. of Germany .
394394 6/1933 United Kingdom .

OTHER PUBLICATIONS

S. Seely, "Effect of Stray Flux on Current Transformers", Journal of Science & Technology, vol. 37, No. 3, 1970.

Primary Examiner—Thomas J. Kozma
Attorney, Agent, or Firm—Sandler, Greenblum & Bernstein

[57] ABSTRACT

A device for measuring electric current includes a toric core having a gap that establishes a pair of opposed end faces, and a continuous conductor having terminal ends and wound around the core in contiguous turns forming a toric solenoid interrupted by the gap. The solenoid has first and second ends adjacent the respective end faces of the core, and the conductor at each end of the solenoid passes through the core and extends along the axis thereof from the opposed end faces of the core such that the terminal ends of the conductor are located diametrically opposite the gap. A first compensation coil is serially connected to said first end of the solenoid such that the first coil overlies the first end of the solenoid to which the first compensation coil is connected.

3 Claims, 1 Drawing Sheet

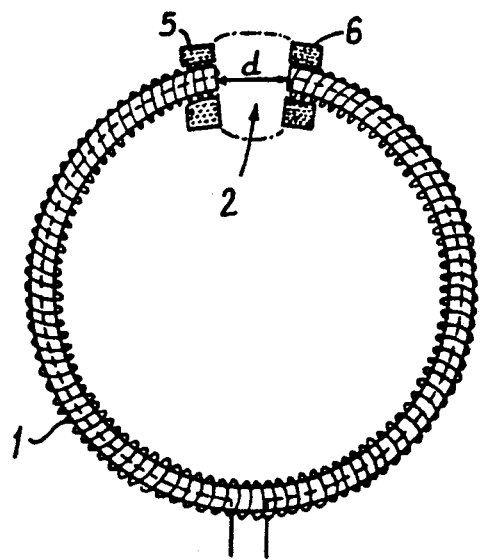
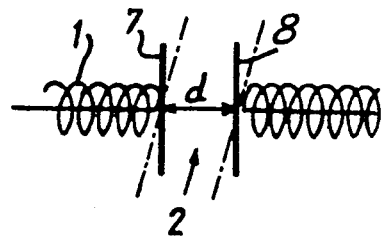
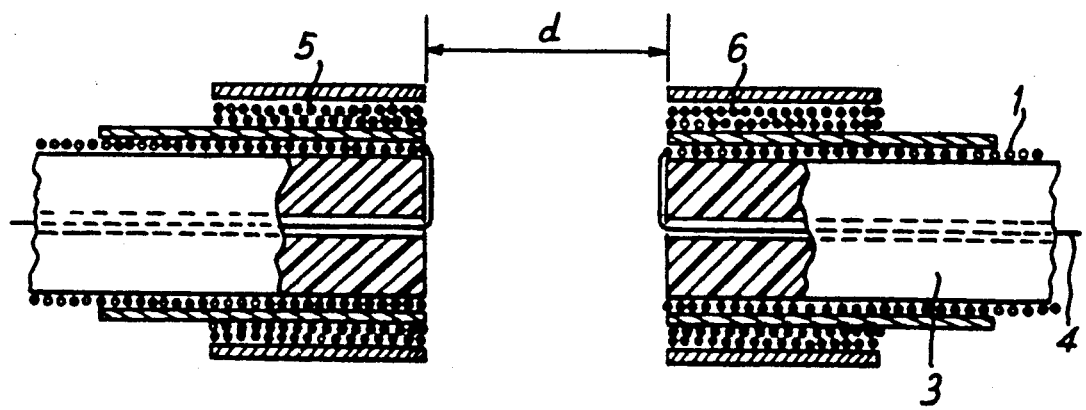
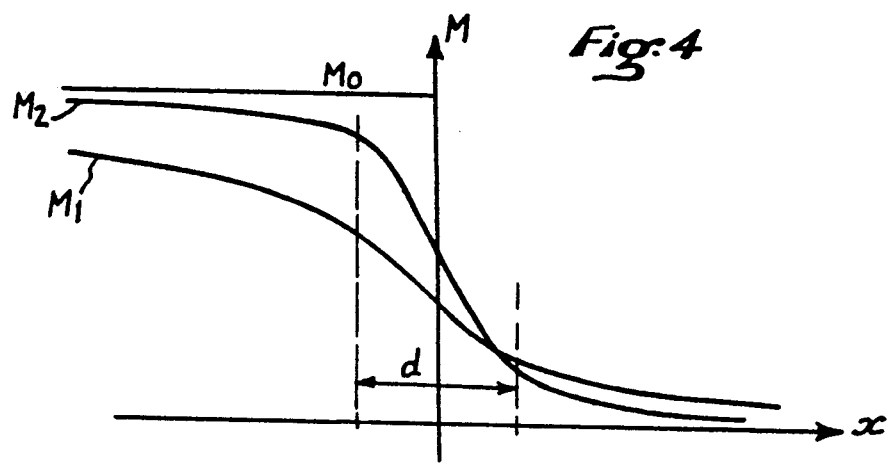

DEVICE FOR MEASURING AN ELECTRIC CURRENT USING A SOLENOID WITH REGULAR PITCH IN THE FORM OF A TORUS

This application is a continuation of application Ser. No. 07/275,702, filed Nov. 25, 1988 now abandoned which is a continuation of prior application Ser. No. 004,247, filed Jan. 5, 1987, now abandoned which is a continuation of prior application Ser. No. 698,378, filed Feb. 5, 1985 now abandoned.

BACKGROUND OF THE INVENTION

The present invention relates to a device for measuring an electric current using a solenoid with regular pitch in the form of a torus.

In the study of the media traversed by electric currents, such as electrolytes, plasmas, it is necessary to locate the lines of current and to know the intensities thereof. A conventional device which is used to measure a current distributed in space and passing through a surface, is constituted by a so-called "Rogowski" belt bearing on the contour of this surface. This belt is constituted by a toric solenoid coiled with a regular pitch and the voltage which is induced in this belt is integrated with respect to time, by an analog integrator or by a fluxmeter. The signal thus obtained or the indication of the fluxmeter is proportional to the current to be measured. A temporary variation of the current may thus be demonstrated, resulting for example its establishment or its interruption.

The coefficient of mutual induction between the coil constituting the long and narrow, closed toric solenoid, and a line of current traversing once, inside the solenoid, a surface bearing on the solenoid, is constant whilst it is zero if the line of current does not intersect said surface.

It is clear that a closed solenoid does not allow measurement of a permanent direct current flowing in an electric circuit since, topologically, the electric circuit on the one hand and the closed toric solenoid on the other hand cannot pass from a remote position to an interlaced position. However, the measurement can be made by using a deformable solenoid adapted to open without breaking the electrical continuity. In that case, operation is as follows: starting from the solenoid without current, it is opened, the current to be measured is surrounded and the solenoid is closed again. However, this procedure is possible only if the current to be measured is fixed in space or moves slowly. In the case of currents distributed in space and rapidly variable, this procedure is inapplicable.

SUMMARY OF THE INVENTION

It is an object of the present invention to overcome these drawbacks by providing a device of particularly simple design allowing the measurement of current which are rapidly variable in time and in space, without presenting an obstacle to the movement of these currents.

To this end, this device for measuring an electric current includes a toric core having a gap that establishes a pair of opposed end faces, and a continuous conductor having terminal ends, and wound around the core in contiguous turns forming a toric solenoid interrupted by the gap. The solenoid has first and second ends adjacent the respective end faces of the core, and the conductor at each end of the solenoid passes through the core and extends along the axis thereof from the opposed end faces of the core such that the terminal ends of the conductor are located diametrically opposite the gap. A first compensation coil is serially connected to said first end of the solenoid such that the first coil overlies the first end of the solenoid to which the first compensation coil is connected.

The current measuring device according to the invention offers the advantage that it presents no obstacle to the propagation and to the movement of the lines of current. Furthermore, thanks to the provision of the or each compensation coil, the coefficient of mutual induction of the compensated solenoid follows a law of variation, as a function of the position, with respect to the gap in the solenoid, of an infinite line of current passing through the plane on which this solenoid bears, which is very close to the ideal law according to which this coefficient of mutual induction has a constant value inside the solenoid and a zero value outside the solenoid.

The measuring device according to the invention may be used in numerous domains, for example in that of plasma physics where the currents are rapidly variable in time and in space, or in electrotechniques in the study of blow-out in the housings of circuit breakers. It may be used as clip forming intensity sensor and remaining permanently open. It may also be used for measuring the distribution of currents distributed in space.

BRIEF DESCRIPTION OF THE DRAWINGS

The invention will be more readily understood on reading the following description with reference to the accompanying drawings, in which:

FIG. 1 is a schematic plan view of a device for measuring an electric current incorporating a solenoid provided with two compensation coils according to the invention.

FIG. 2 is a view in axial section, on a larger scale, of an embodiment of the two opposite ends of the solenoid defining the gap made therein.

FIG. 3 is an electrical diagram of a variant embodiment in which the compensation coils are constituted by flat coils.

FIG. 4 is a diagram illustrating the variation of the coefficient of mutual induction as a function of the position of an infinite line of current with respect to the gap formed in the solenoid.

DESCRIPTION OF THE PREFERRED EMBODIMENTS

Referring now to the drawings, the current measuring device shown in FIG. 1 comprises a main solenoid 1 in the form of a torus but which is interrupted over a portion of its length d to define, at that spot, a free space or gap 2. This solenoid 1 may be made by means of a fine enamelled wire forming contiguous turns on a toric core 3 constituted, for example, by a supple polymer tube. The number n of turns, per unit of length, of the wire constituting the main solenoid 1 is constant along the whole solenoid. The interior of the tube 3 constituting the core of the solenoid 1 is used for the passage of a conductor wire 4 connecting each end of the main solenoid to an outside measuring apparatus (analog integrator or fluxmeter).

The gap 2, of length d, which is made according to the invention in the main solenoid constitutes a free passage allowing a free relative displacement of a line of current of which the intensity is to be measured and of the measuring device according to the invention. In the absence of the gap 2, i.e. if the solenoid forms a closed torus, the coefficient of mutual induction $M_0$ of such a closed toric solenoid with an interior current, i.e. a line of current traversing, inside the solenoid 1, the surface on which this solenoid bears, has a constant value $M_0$, whilst this coefficient of mutual induction is zero for the currents outside the solenoid. The variation of the coefficient of mutual induction is shown in the diagram of FIG. 4, x being defined as being the position, with respect to the gap 2, of an infinite line of current passing through the plane on which the solenoid 1 bears. The curve $M_1$ illustrates the variation of the coefficient of mutual induction in the case of the gap 2 being formed in the solenoid 1, without other measures being taken to compensate the creation of this gap. For positive values of x, i.e. for currents normally outside the solenoid 1, there is a non-zero coefficient $M_1$, which is detrimental, as currents remote from the gap 2 are thus measured.

To overcome this drawback, according to the invention, an additional, so-called compensation coil is provided on at least one of the two ends of the solenoid located in the immediate vicinity of the gap 2, which coil is connected in series with the main solenoid 1 so that the voltages induced in this main solenoid and in the additional compensation coil are added.

In the non-limiting embodiment shown in the drawings, the measuring device comprises two additional compensation coils 5 and 6 provided respectively at the two ends of the solenoid 1 limiting the gap 2. These two compensation coils 5, 6 which are connected in series with the solenoid 1, are made in cylindrical form and they surround, respectively, the two end parts of the solenoid 1 defining the gap 2. According to a variant embodiment, the compensation coils may be housed inside the end parts of the solenoid 1.

The compensation coil or coils 5, 6 may comprise one single layer of turns or a plurality of layers, for example two as illustrated in the embodiment shown in FIG. 2.

The compensation obtained may be verified by placing the gap 2, surrounded by the compensation coils 5, 6, in an uniform magnetic A.C. field produced, for example, by a pair of so-called Helmholtz coils. The distance d is then adjusted in order to annul the induced voltage and the distance d thus found must then be conserved.

Thanks to the provision of the compensation coils 5, 6, a law of variation of the coefficient of mutual induction $M_2$ of the compensated solenoid 1 nearest the ideal law is obtained, as may be seen in FIG. 4. The zone in which the coefficient of mutual induction $M_2$ varies substantially is then of the order of the width d of the gap 2.

The compensation coils 5, 6 may be made in different ways and they may constitute flat coils 7, 8, as shown in FIG. 3, or coils having any form of revolution. These flat coils 7, 8 may have the same axis as the ends of the main solenoid 1, by bearing on two parallel planes defining the free space around the gap 2. These flat coils 7, 8 may also be inclined with respect to the axis of the solenoid 1, as indicated in chain-dotted line in FIG. 3.

According to a variant embodiment, the cylindrical compensation coils 5, 6 or flat ones 7, 8 may be designed so as to be mechanically and/or electrically pluggable on the ends of the main solenoid 1. Each pair of cylindrical (5,6) or flat (7,8) coils is then adapted to a particular length d of the gap 2. In other words, the measuring device according to the invention may be made in the form of main solenoids presenting different gap lengths d, and with each particular gap length there is associated a pair of compensation coils comprising an assembly of turns presenting characteristics appropriate for ensuring compensation of the existence of the gap in question.

What is claimed is:

1. A device for measuring electric current comprising:

(a) a toric core having a gap that establishes a pair of opposed end faces;

(b) a continuous conductor having terminal ends and wound around said core in contiguous turns forming a toric solenoid interrupted by said gap, and said solenoid having first and second ends adjacent the respective end faces of the core;

(c) the conductor at each end of the solenoid passing through the core and extending along the axis thereof from the opposed end faces of the core such that the terminal ends of the conductor are located diametrically opposite the gap; and (d) a first compensation coil serially connected to said first end of the solenoid, said first coil overlying the first end of the solenoid to which the first coil is connected.

2. A device according to claim 1 including a second compensation coil serialy connected to said second end of the solenoid, the second coil overlying the second end of the solenoid.

3. A device according to claim 1 wherein said terminal ends of said conductor terminate exterior to said toric core.

* * * * *